United States Patent
Lin et al.

(10) Patent No.: US 9,285,434 B2
(45) Date of Patent: Mar. 15, 2016

(54) DC-BASED UNINTERRUPTIBLE POWER SYSTEM AND METHOD FOR DETECTING ABNORMAL VOLTAGE

(71) Applicants: LITE-ON ELECTRONICS (GUANGZHOU) LIMITED, Guangzhou (CN); LITE-ON TECHNOLOGY CORPORATION, Taipei (TW)

(72) Inventors: Liang-Chun Lin, New Taipei (TW); Te-Yu Chou, Taipei (TW); Ming-Wang Cheng, Taoyuan County (TW); Wei-Lieh Lai, New Taipei (TW)

(73) Assignees: LITE-ON ELECTRONICS (GUANGZHOU) LIMITED, Guangzhou (CN); LITE-ON TECHNOLOGY CORPORATION, Taipei (TW)

( * ) Notice: Subject to any disclaimer, the term of this patent is extended or adjusted under 35 U.S.C. 154(b) by 369 days.

(21) Appl. No.: 14/027,163

(22) Filed: Sep. 14, 2013

(65) Prior Publication Data

US 2014/0333137 A1  Nov. 13, 2014

(30) Foreign Application Priority Data

May 10, 2013 (CN) .......................... 2013 1 0173563

(51) Int. Cl.
*G01R 31/40* (2014.01)
*H02J 9/06* (2006.01)

(52) U.S. Cl.
CPC ................. *G01R 31/40* (2013.01); *H02J 9/061* (2013.01); *Y10T 307/625* (2015.04)

(58) Field of Classification Search
CPC ...... H02J 9/061; G01R 31/40; Y10T 307/625
USPC .......................................................... 307/66
See application file for complete search history.

(56) References Cited

U.S. PATENT DOCUMENTS

| 6,894,461 B1 * | 5/2005 | Hack ......................... G05F 1/70 307/82 |
| 2007/0222415 A1 * | 9/2007 | Shah ....................... H02J 9/061 320/107 |

* cited by examiner

*Primary Examiner* — Rexford Barnie
*Assistant Examiner* — Toan Vu
(74) *Attorney, Agent, or Firm* — Li & Cai Intellectual Property (USA) Office

(57) ABSTRACT

A direct current (dc) uninterruptible power system is disclosed. The dc-based uninterruptible power system includes a multiplexer, a battery unit, a linear regulator, a switch-transistor, a voltage comparator and micro controller. The multiplexer receives a first control signal, a first reference voltage and a second reference voltage and outputs a control voltage according to the first control signal. The switch-transistor has a body diode and the body diode has a conduction voltage. When the dc-based uninterruptible power system is non-discharge mode, the switch-transistor is switched-off and the linear regulator receives the first reference voltage, so that the subtraction of the output voltage and the power-supply voltage is smaller than the conduction voltage to cutoff the body diode.

8 Claims, 5 Drawing Sheets

DC-BASED UNINTERRUPTIBLE POWER SYSTEM AND METHOD FOR DETECTING ABNORMAL VOLTAGE

BACKGROUND OF THE INVENTION

1. Field of the Invention

The instant disclosure relates to a DC-based uninterruptible power system; in particular, to an abnormal voltage detection method used for the DC-based uninterruptible power system.

2. Description of Related Art

In recent years, personal computer, communication equipment, workstations and other kinds of hardware equipment are widely used in all level of society with the rapid development of information industry. As information itself is a high value-added product, so people find ways to ensure safety of information and the normal operation of the computer system, and requirement for the power quality have become increasingly strict. Since a large number of power electronic equipment are be used, harmonics generated from power electronic equipment cause poor power quality and natural disasters, and further result in utility power not to guarantee a stable supply of high-quality. Uninterruptible power supply system (UPS) immediately become indispensable equipment for computer or communication system.

UPS can avoid data loss and damage of the electronic device resulted from power anomalies, and can effectively protect the internal component of electronic device to ensure the life and precision of electronic device. In addition, when an emergency power fails (e.g., a sudden power failure), can also to be the buffer time on shutdown. Currently, UPS on the market are mostly external; which means, UPS is disposed outside the host independently, and is electrically connected to electric wire of the host. Generally, UPS have discharge mode and non-discharge mode, and a means to switch two modes is through detecting the supply situation of the output-side, so as to determine switch two modes, so how to detect supply situation precisely and quickly is important. In real application, in order to meet effect of outputting the high-current output immediately, a linear regulator usually maintains open-state, and be with another switch element (e.g., MOS) to avoid DC current to return. However, when UPS is in non-discharge mode and the linear regulator maintains open-state, current will flow to the output-side through a conduction of a body diode of the MOS so that an voltage comparator does not detect supply situation of the output-side quickly and loss of an power energy happens in the non-discharge mode. Accordingly, a battery of the UPS needs to be charging frequently so as to significantly reduce life of battery.

SUMMARY OF THE INVENTION

The instant disclosure provides a DC-based uninterruptible power system. The DC-based uninterruptible power system is electrically connected to a DC power supply. The DC-based uninterruptible power system outputs a DC voltage to be served as a supply voltage in a non-discharge mode and provides the DC voltage to a load, wherein when the DC power supply interrupts electric power, the DC-based uninterruptible power system enters a discharge mode. The DC-based uninterruptible power system comprises a multiplexer, a battery unit, a linear regulator, a switch transistor, a voltage comparator and a microcontroller. The multiplexer is electrically receiving a first control signal, a first reference voltage and a second reference voltage and outputs a control voltage according to the first control signal, wherein the control voltage is either the first reference voltage or the second reference voltage. The battery unit is electrically connected to the DC power supply via a charging circuit, and the battery unit is used for outputting a discharge current in the discharge mode. The linear regulator is electrically connected to the battery unit for receiving a battery voltage and is electrically connected to the multiplexer for receiving the control voltage, and selectively outputs an output voltage in normal on-state with the discharge current from the battery unit to the load in the discharge mode according to the control voltage, wherein different voltage values of the control voltage are corresponding to different voltage values of the output voltage. The switch transistor has a gate, a drain, a source and a body diode. The gate of the switch transistor is electrically connected to the multiplexer so as to receive a second control signal and accordingly determines switched-on state or switched-off state. The drain of the switch transistor is electrically connected to the linear regulator so as to receive the output voltage. The source of the switch transistor is electrically connected to the load, wherein the body diode has a conduction voltage. When the DC-based uninterruptible power system is in non-discharge mode, the control voltage received by the linear regulator is the first reference voltage and the switch transistor enters switched-off state, so that a subtraction result of the output voltage and the supply voltage is smaller than the conduction voltage so as to cutoff the body diode. The voltage comparator is electrically connected to source of the switch transistor so as to receive the supply voltage for detecting the a power supply status of the DC power supply and compares the supply voltage and a third reference voltage received from an outside source so as to output a third control signal accordingly. The microcontroller is electrically connected between the voltage comparator and the multiplexer for receiving the third control signal and transmits the first control signal and the second control signal to the multiplexer and gate of the switch transistor correspondingly according to the third control signal, so as to instruct the multiplexer to choose either the first reference voltage or the second reference voltage and control switched-on state or switched-off state of the switch transistor.

In an embodiment of the instant disclosure, wherein when the DC-based uninterruptible power system is in the discharge mode, the control voltage received by the linear regulator is the second reference voltage and the switch transistor enters switched-on state, so that the output voltage is equal to predetermined voltage value of the supply voltage, wherein the non-discharge mode is that the DC power supply provides electric power to the load, and the discharge mode is that the battery unit provides electric power to the load.

In an embodiment of the instant disclosure, wherein when the voltage comparator determines that the DC power supply provides electric power normally, the voltage comparator transmits the third control signal to the microcontroller so that the microcontroller transmits the first control signal and the second control signal to the multiplexer and the switch transistor, and the multiplexer chooses the first reference voltage to be served as the control voltage according to the first control signal and transmits the control voltage to the linear regulator.

In an embodiment of the instant disclosure, wherein when the voltage comparator determines that the DC power supply interrupts electric power, the voltage comparator transmits the third control signal to the microcontroller so that the microcontroller transmits the first control signal and the second control signal to the multiplexer and switch transistor respectively, and the multiplexer chooses the second reference voltage to be served as the control voltage and transmits the control voltage to the linear regulator.

In an embodiment of the instant disclosure, wherein a positive terminal and a negative terminal of the voltage comparator respectively receives the supply voltage and the third reference voltage, wherein the third reference voltage is smaller than predetermined voltage value of the supply voltage.

In an embodiment of the instant disclosure, the multiplexer comprises a first switch and a second switch. One terminal of the first switch receives the first reference voltage, another terminal of the first switch is electrically connected to the linear regulator, and the first switch receives a first switch signal and accordingly determines switched-on state or switched-off state. One terminal of the second switch receives the second reference voltage, another terminal of the second switch is electrically connected to the linear regulator, and the second switch receives the second switch signal and accordingly determines switched-on state or switched-off state, wherein the first switch signal and the second switch signal are the first control signal.

The instant disclosure provides an abnormal voltage detection method used for a DC-based uninterruptible power system. The DC-based uninterruptible power system is electrically connected to a DC power supply. The dc-based uninterruptible power system outputs a DC voltage to be served as a supply voltage in a non-discharge mode and provides the DC voltage to a load, wherein when the DC power supply interrupts electric power, the DC-based uninterruptible power system enters a discharge mode. The DC-based uninterruptible power system comprises a multiplexer, a battery unit, a linear regulator, a switch transistor, a voltage comparator and a microcontroller. The multiplexer is electrically receiving a first control signal, a first reference voltage and a second reference voltage and outputs a control voltage according to the first control signal, wherein the control voltage is either the first reference voltage or the second reference voltage. The battery unit is electrically connected to the DC power supply via a charging circuit, and the battery unit is used for outputting a discharge current in the discharge mode. The linear regulator is electrically connected to the battery unit for receiving a battery voltage and is electrically connected to the multiplexer to receive the control voltage, and selectively outputs an output voltage in normal on-state with discharge current from the battery unit to the load in the discharge mode according to the control voltage, wherein different voltage values of the control voltage are corresponding to different voltage values of the output voltage. The switch transistor has a gate, a drain, a source and a body diode, the gate of the switch transistor is electrically connected to the multiplexer so as to receive a second control signal and accordingly determines switched-on state or switched-off state, the drain of the switch transistor is electrically connected to the linear regulator so as to receive the output voltage, and the source of the switch transistor is electrically connected to the load, wherein the body diode has a conduction voltage. The voltage comparator is electrically connected to source of the switch transistor so as to receive the supply voltage for detecting a power supply status of the DC power supply and compares the supply voltage and a third reference voltage received from an outside source so as to output a third control signal accordingly. The microcontroller is electrically connected between the voltage comparator and the multiplexer for receiving the third control signal and transmits the first control signal and the second control signal to the multiplexer and gate of the switch transistor correspondingly according to the third control signal, so as to instruct the multiplexer to choose either the first reference voltage or the second reference voltage and control switched-on state or switched-off state of the switch transistor. The abnormal voltage detection method comprises steps as follows: determining whether the DC-based uninterruptible power system is in the non-discharge mode; and if the DC-based uninterruptible power system is in the non-discharge mode, the control voltage received by the linear regulator is the first reference voltage and the switch transistor enters switched-off state, so that a subtraction result of the output voltage and the supply voltage is smaller than the conduction voltage so as to cutoff the body diode.

In summary, the DC-based uninterruptible power system and method for detecting abnormal voltage provided by the instant disclosure, utilizes the voltage comparator to quickly detect electric power situation of the supply voltage of the output-side when the linear regulator opens, and reduces simultaneously energy loss of the battery unit or other energy-storing device in the non-discharge mode, so as to achieve the effect of providing electric power normally.

For further understanding of the instant disclosure, reference is made to the following detailed description illustrating the embodiments and examples of the instant disclosure. The description is only for illustrating the instant disclosure, not for limiting the scope of the claim.

DETAILED DESCRIPTION OF PREFERRED EMBODIMENTS

Figure 1:
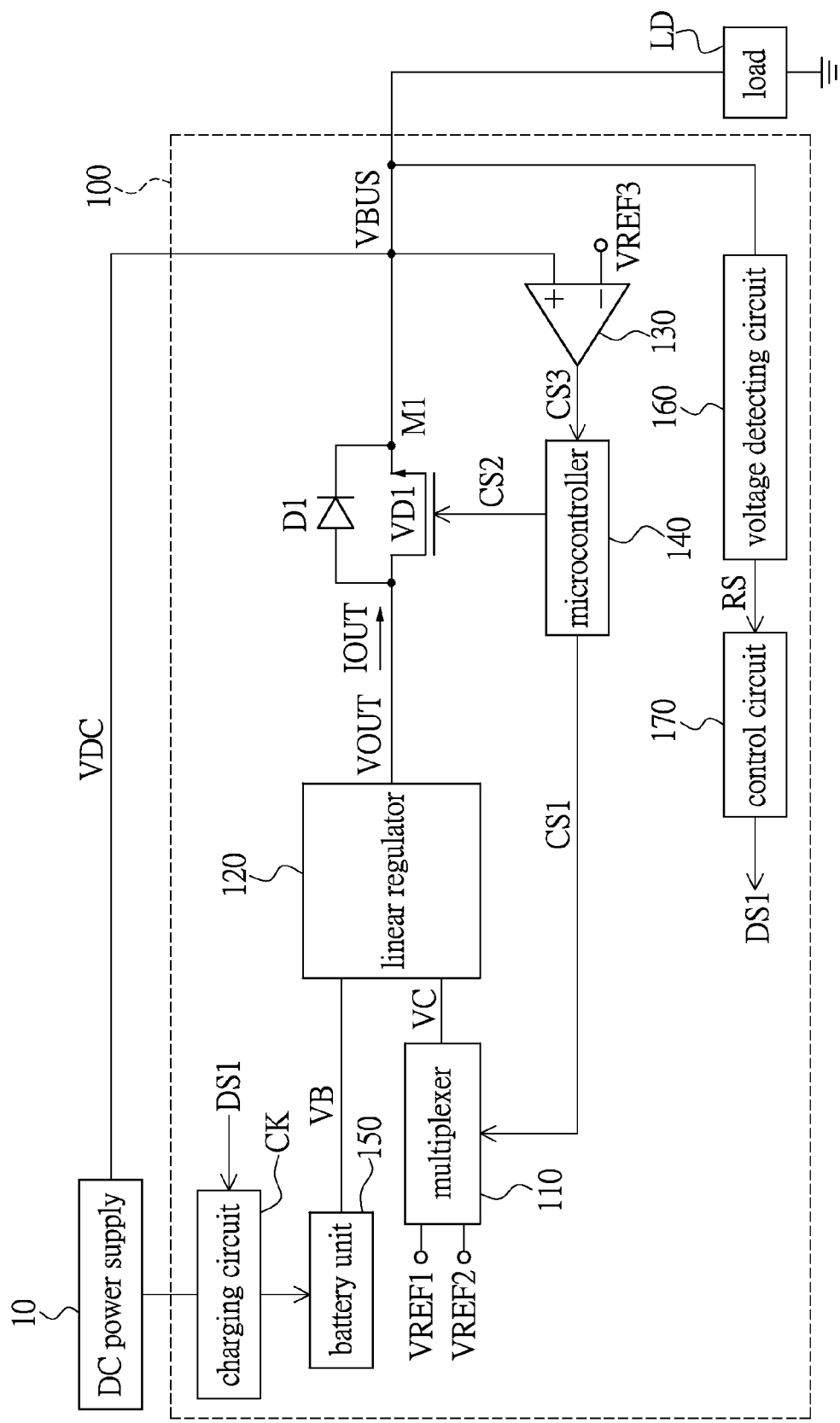
FIG. 1 shows circuit schematic diagram of the DC-based uninterruptible power system according to one embodiment of the instant disclosure.

The aforementioned illustrations and following detailed descriptions are exemplary for the purpose of further explaining the scope of the instant disclosure. Other objectives and advantages related to the instant disclosure will be illustrated in the subsequent descriptions and appended drawings. In the drawings, the size and relative sizes of layers and regions may be exaggerated for clarity.

It will be understood that, although the terms first, second, third, and the like, may be used herein to describe various elements, components, regions, layers and/or sections, these elements, components, regions, layers and/or sections should not be limited by these terms. These terms are only to distinguish one element, component, region, layer or section from another region, layer or section discussed below could be termed a second element, component, region, layer or section without departing from the teachings of the present disclosure. As used herein, the term "and/or" includes any and all combinations of one or more of the associated listed items.

[One Embodiment of the DC-Based Uninterruptible Power System]

Referring to FIG. 1, FIG. 1 shows circuit schematic diagram of the DC-based uninterruptible power system according to one embodiment of the instant disclosure. As shown in FIG. 1, the DC-based uninterruptible power system 100 is electrically connected to a DC power supply 10. The DC-based uninterruptible power system 100 outputs a DC voltage VDC to be served as a supply voltage VBUS in a non-discharge mode and provides the DC voltage VDC to a load LD, wherein when the DC power supply 10 interrupts electric power, the DC-based uninterruptible power system 100 enters a discharge mode. The DC-based uninterruptible power system 100 comprises a multiplexer 110, a linear regulator 120, a switch transistor M1, a voltage comparator 130, a microcontroller 140, a battery unit 150, a voltage detecting circuit 160 and a control unit 170, wherein the switch transistor M1 has a gate, a drain, a source and a body diode. The battery unit 150 is electrically connected to the DC power supply 10 via a charging circuit CK. The linear regulator 120 is electrically connected to a multiplexer 110 and the battery unit 150. A gate of the switch transistor M1 is electrically connected to the microcontroller 140, a drain of the switch transistor M1 is electrically connected to the linear regulator 120, and a source of the switch transistor M1 is electrically connected to an output-side of the DC-based uninterruptible power system 100 and the load LD. A positive terminal of the voltage comparator 130 is electrically connected to the source of the switch transistor M1, and a negative terminal of the voltage comparator 130 receives the third reference voltage VREF3. The microcontroller 140 is electrically connected between the multiplexer 110 and the voltage comparator 130. The voltage detecting circuit 160 is electrically connected to the output-side of the DC-based uninterruptible power system 100 so as to detect the supply voltage VBUS and output an output voltage detecting result RS. The control unit 170 is electrically connected to the voltage detecting circuit 160 and outputs a charging signal DS1 to the charging circuit CK according to the output voltage detecting result RS.

Regarding the multiplexer 110, the multiplexer 110 receives a first control signal CS1, a first reference voltage VREF1 and a second reference voltage VREF2 and outputs a control voltage VC to the linear regulator 120 according to the first control signal CS1, wherein the control voltage VC is either the first reference voltage VREF1 or the second reference voltage VREF2. In other words, the multiplexer 110 chooses one of the first reference voltage VREF1 and the second reference voltage VREF2 to be served as the control voltage VC of the linear regulator 120, according to the first control signal CS1.

Regarding the linear regulator 120, the linear regulator 120 receives the battery voltage VB and the control voltage VC, wherein the battery voltage VB is provided by the battery unit 150. In the embodiment, the linear regulator 120 is a regulator with adjustable output voltage; which means, the linear regulator 120 selectively outputs or adjusts an amount of the output voltage VOUT in normal on-state with the discharge current from the battery unit to the load in the discharge mode, wherein different voltage values of the control voltage are corresponding to different voltage values of the output voltage. Moreover the linear regulator 120 maintains an open-state so as to provide the discharge current IOUT to the load LD from the battery unit 150 in the discharge mode. It is worth mentioning that, in the instant disclosure, the linear regulator 120 needs to maintain the open-state in the discharge mode and non-discharge mode, so as to achieve the effect of large current instantly.

Regarding the switch transistor M1, the switch transistor M1 is electrically connected between the linear regulator 120 and the output-side of the DC-based uninterruptible power system 100, and the switch transistor M1 is used for avoiding DC-side current to return. The gate of the switch transistor M1 receives the second control signal CS2 transmitted from the microcontroller 140 and accordingly determines switched-on state or switched-off state itself. The drain of the switch transistor M1 receives the output voltage VOUT transmitted from the linear regulator 120, and a source of the switch transistor M1 outputs the supply voltage VBUS to the load LD. Moreover, the switch transistor M1 has a body diode D1, an anode of the body diode D1 is electrically connected to the drain of the switch transistor M1, a cathode of the switch transistor M1 is electrically connected to the source of the switch transistor M1, wherein the switch transistor M1 has a conduction voltage VD1.

Regarding the voltage comparator 130, a positive terminal and a negative terminal of the voltage comparator 130 respectively receives the supply voltage VBUS and the third reference voltage VREF3 transmitted from an outside source, and then the voltage comparator 130 compares the supply voltage VBUS with the third reference voltage VREF3 and accordingly outputs the third control signal CS3 with information of electric power status to the microcontroller 140. In short, the voltage comparator 130 is used for determining whether the DC power supply 10 interrupts electric power via detecting the supply voltage VBUS, wherein voltage value of the third reference voltage VREF3 is smaller than predetermined voltage value of the supply voltage VBUS, and the designer may do further decision according to a demand of the circuit design or real application, and it is not limited thereto.

Regarding the microcontroller 140, the microcontroller 140 receives the third control signal CS3 with information of electric power status and respectively transmits the first control signal CS1 and the second control signal CS2 to the multiplexer 110 and the gate of the switch transistor M1 correspondingly, so as to instruct the multiplexer 100 choose one of the first reference voltage VREF1 and the second reference voltage VREF2 and further control the switched-on state or switched-off state of the switch transistor M1.

Regarding the battery unit 150, the battery unit 150 is used to outputting the discharging current IOUT to the load LD in the discharge mode. In other words, when the voltage comparator 130 determines the DC power supply 130 interrupting electric power, the DC-based uninterruptible power system 100 may enter the discharge mode and provide electric power to the load LD via the discharging current IOUT of batter unit 150.

In the following description is further instruction in teaching a work mechanism of the DC-based uninterruptible power system 100. Before further instruction, it is clarified that a power supply circuit includes the DC power supply 10 and the DC-based uninterruptible power system 100. The DC-based uninterruptible power system 100 has the non-discharge mode and the discharge mode, and may switch two modes of the DC-based uninterruptible power system 100 via detecting electric power status of the output-side of the power supply circuit (i.e., the output-side of the DC-based uninterruptible power system 100). Therefore, it is important to detect electric power status precisely and quickly, and for the effect of providing large current instantly, the linear regulator 120 needs to maintain open-state.

Figure 2:
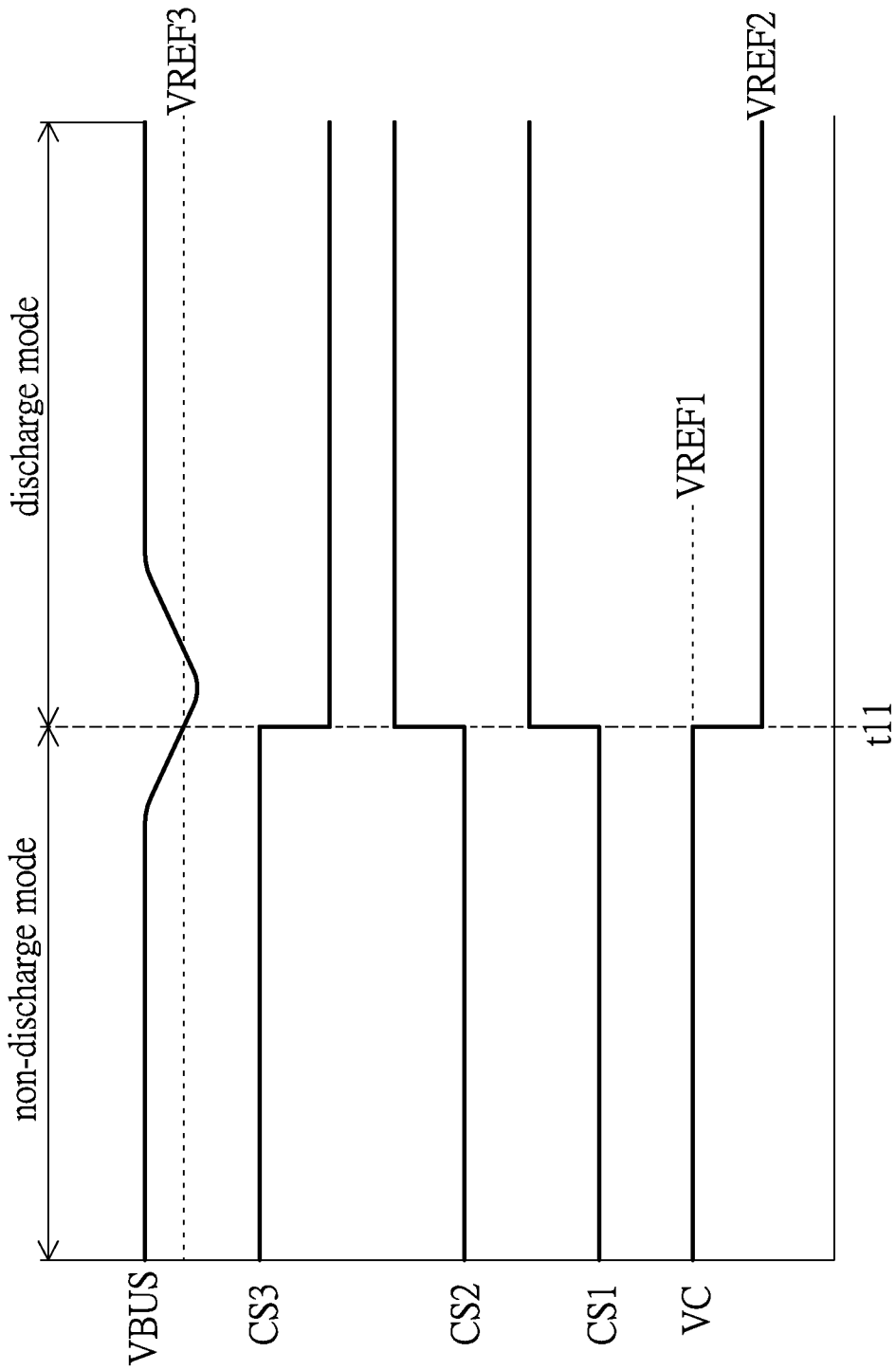
FIG. 2 shows waveform diagram corresponding to FIG. 1 of the DC-based uninterruptible power system.

Referring to FIGS. 1 and 2, FIG. 2 shows waveform diagram corresponding to FIG. 1 of the DC-based uninterruptible power system. In the non-discharging mode, the DC voltage VDC outputted from the DC power supply 10 is served as the supply voltage VBUS and is used for providing electric power to the load LD. When the voltage detecting circuit 160 detects that the DC power supply 10 provides electric power to the load LD, voltage detecting circuit 160 accordingly transmits the voltage detecting result RS to the control unit 170, so that the control unit 170 transmits a charging signal DS1 to the charging circuit CK, and then the DC power supply 10 is charging for the battery unit 150 via a charging circuit CK. Meanwhile, the battery unit 150 also provides a battery voltage VB to the linear regulator 120. Next, when the voltage comparator 130 compares the supply voltage VBUS and third reference voltage VREF3 and accordingly determines that the DC power supply 10 provides electric power normally, i.e., the supply voltage VBUS is larger than the third reference voltage VREF3, the voltage comparator 130 may output the third control signal CS3 with high voltage level to the microcontroller 140, wherein the voltage value of the third reference voltage VREF3 is smaller than predetermined voltage value of the supply voltage VBUS. Next, the microcontroller 140 proceeds associated control mechanisms according to the third control signal CS3 received with high voltage level. Furthermore, the microcontroller 140 may respectively output the second control signal CS2 with low voltage level and the first control signal with low voltage level to the gate of the switch transistor M1 and the multiplexer 110 correspondingly. Afterwards, the multiplexer 110 chooses the first reference voltage VREF1 to be served as the control voltage VC according to the first control signal CS1 with low voltage level (i.e., digital logic signal [0]), and the control voltage VC is transmitted to the linear regulator 120. Meanwhile, the switch transistor M1 enters the switched-off state according to the second control signal CS2 with low voltage level. Next, the linear regulator 120 outputs the output voltage VOUT according to the control voltage VC received. It is worth noticing that, in non-discharge mode, the output voltage VOUT outputted from the linear regulator 120 makes the DC-based uninterruptible power system 100 satisfy a condition, which is a subtraction result of the output voltage VOUT and the supply voltage VBUS is smaller than the conduction voltage VD1. In other words, the output voltage VOUT is smaller than a sum of the supply voltage VBUS and the conduction voltage VD1 at least, so as to cutoff the body diode D1. Accordingly, in non-discharge mode, when the linear regulator 120 maintains the open-state, the output current IOUT does not flow to the output-side of the DC-based uninterruptible power system 100 via current path of the body diode D1, so that the embodiment not only effectively detects the supply voltage VBUS of the output-side of the power supply circuit, but also reduces energy loss in the non-discharge mode, and avoids reducing battery life due to frequently charge the battery unit 150 or energy-storing device of the DC-based uninterruptible power system 100.

Regarding discharge mode, when the voltage comparator 130 compares the supply voltage VBUS with the third reference voltage VREF3 at time t11 and accordingly detects that the DC power supply 10 interrupt electric power; which means, when the supply voltage VBUS decreases and is smaller than the third reference voltage VREF3, the voltage comparator 130 transits the third reference voltage VREF3 with high voltage level to the third reference voltage VREF3 with low voltage level and transmits the third control signal CS3 to the microcontroller 140, wherein the voltage value of the third reference voltage VREF3 is smaller than the predetermined value of the supply voltage VBUS. Next, the microcontroller 140 may proceed associated control mechanism according to the third control signal CS3 with low voltage level. Furthermore, the microcontroller 140 may respectively output the second control signal CS2 with high voltage level and the first control signal CS1 with high voltage level to the gate of the switch transistor M1 and the multiplexer 110. Afterwards, the multiplexer 110 chooses the second reference voltage VREF2 to be served as the control voltage VC according to the first control signal CS1 with high voltage level, and the control voltage VC is transmitted to the linear regulator 120. Meanwhile, the switch transistor M1 enters switched-on state according to the second control signal CS2 with high voltage level. Next, the linear regulator 120 outputs the output voltage VOUT according to the control voltage VC received. It is worth noticing that, in the discharge mode, the output voltage VOUT outputted from the linear regulator 120 makes the DC-based uninterruptible power system satisfy a condition, which is the voltage value of the output voltage VOUT is substantially equal to predetermined voltage value of the supply voltage VBUS. In other words, the voltage value of the output voltage VOUT is at least larger than the supply voltage VBUS so that a drain-source voltage of the switch transistor M1 is larger than zero. In one embodiment, the predetermined voltage value of the supply voltage VBUS is 12 volts. Accordingly, in discharge mode, the linear regulator 120 may maintain open-state so as to provide larger current instantly, and the output current IOUT may flow to the output-side of the DC-based uninterruptible power system 100 via current path of the switch transistor M1, so as to provide the supply voltage VBUS to the load LD, i.e. the battery unit 150 provides electric energy to the load LD. Accordingly, the voltage comparator 130 as the linear regulator 120 maintains open-state may quickly detect power supply situation of the output-side of power supply circuit, and make the DC-based uninterruptible power system 100 be capable of detecting power supply status of the output-side of the power supply circuit effectively in the discharge mode and the non-discharge mode, and reducing energy loss of the battery unit 150 in the non-discharge mode or other energy-storing device, so as to achieve effect of providing electric power normally.

For specific instruction of relevant details of the DC-based uninterruptible power system 100, there is further instruction along with another drawing.

In the following embodiments, there are only parts different from embodiments in FIG. 1 described, and the omitted parts are indicated to be identical to the embodiments in FIG. 1. In addition, for an easy instruction, similar reference numbers or symbols refer to elements alike.

[Another One Embodiment of the DC-Based Uninterruptible Power System]

Figure 3:
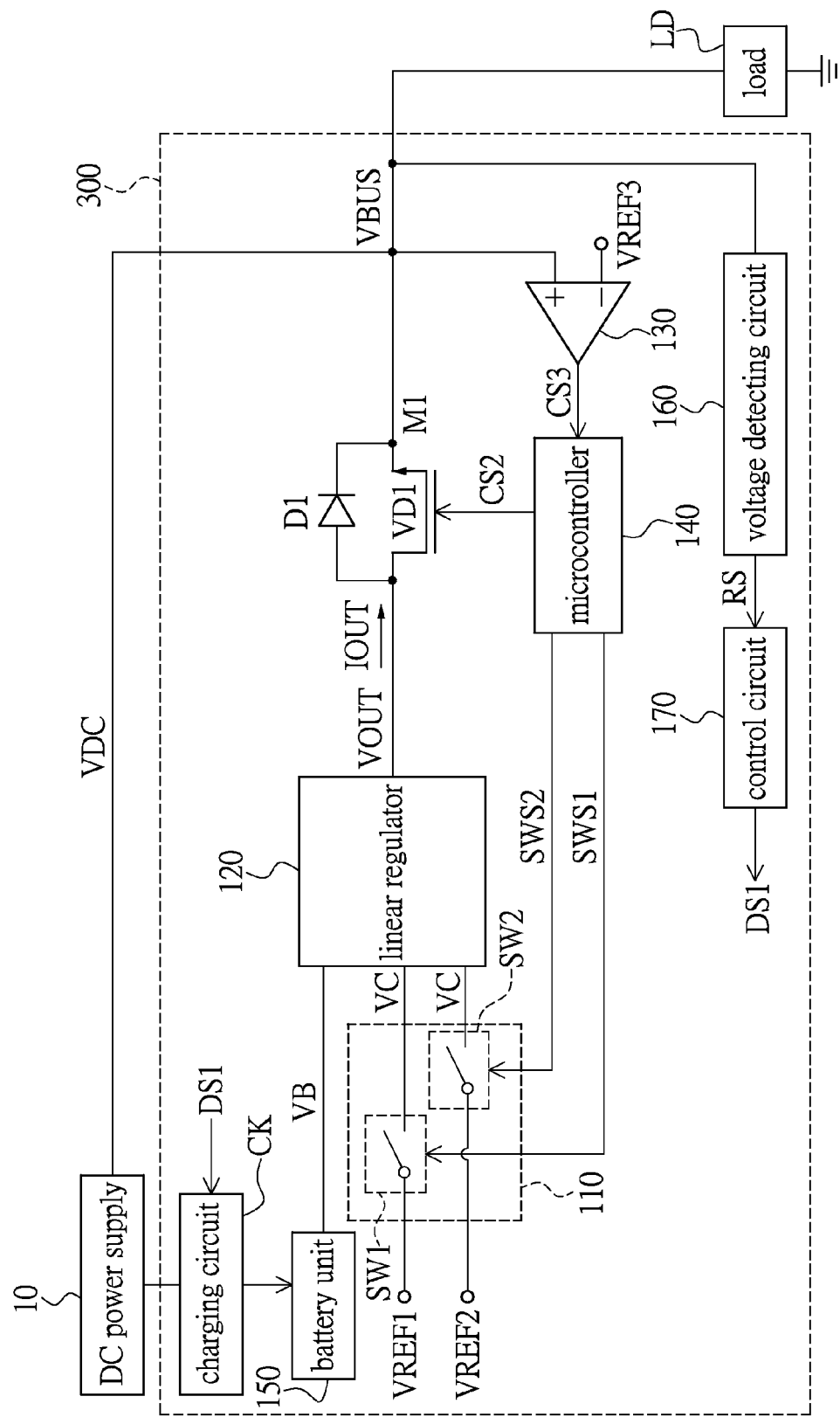
FIG. 3 shows a circuit schematic diagram of the DC-based uninterruptible power system according to another one embodiment of the instant disclosure.

Referring to FIG. 3, FIG. 3 shows a circuit schematic diagram of the DC-based uninterruptible power system according to another one embodiment of the instant disclosure. Different from the embodiment in FIG. 1, the multiplexer 100 includes a first switch SW1 and a second switch SW2 in the embodiment. One terminal of the first switch SW1 receives the first reference voltage VREF1, another terminal of the first switch SW1 is electrically connected to the linear regulator 120, and the first switch SW1 receives a first switch signal SWS1 and accordingly determining switched-on state or switched-off state itself. One terminal of the second switch SW2 receives the second reference voltage VREF2, another terminal of the second switch SW2 is electrically connected to the linear regulator 120, and the second switch SW2 receives the second switch signal SWS2 and accordingly determining switched-on state or switched-off state itself. It is to be clarified that, the first switch signal SWS1 and the second switch signal SWS2 are the first control signal CS1 in the embodiment of FIG. 1.

What follows is further illustrating the operation mechanism of the DC-based uninterruptible power system 300.

Figure 4:
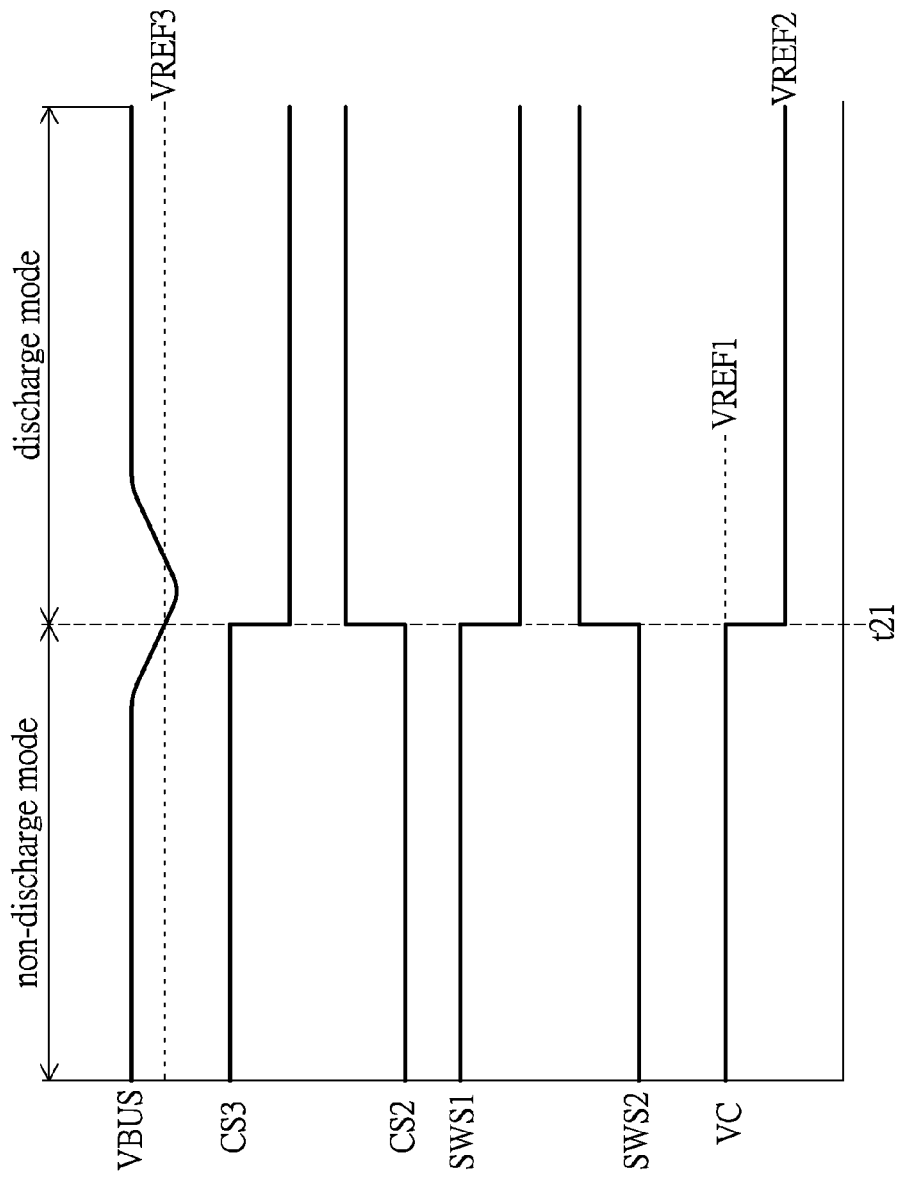
FIG. 4 shows waveform diagram of the DC-based uninterruptible power system corresponding to FIG. 3.

Referring to FIGS. 3 and 4, FIG. 4 shows waveform diagram of the DC-based uninterruptible power system corresponding to FIG. 3. In non-discharge mode, the DC power supply 10 outputs a DC voltage VDC to be served as the supply voltage VBUS so as to provide electric power to the load LD, and when the voltage detecting circuit 160 detects that the DC power supply 10 provides electric power to the load LD, the voltage detecting circuit 160 accordingly transmits voltage detecting result RS to the control unit 170, so that the control unit 170 transmits the charging signal DS1 to the charging circuit CK to make the DC power supply 10 charge for battery unit 150 via the charging circuit CK. Meanwhile, the battery unit 150 may also provide a battery voltage VB to the linear regulator 120. Next, when the voltage comparator 130 compares the supply voltage VBUS and the third reference voltage VREF3 and accordingly detects the DC power supply 10 providing electric power normally, the voltage comparator 130 may output the third control signal CS3 with high voltage level to the microcontroller 140, wherein the voltage value of the third reference voltage VREF3 is smaller than the predetermined voltage value of the supply voltage VBUS. Afterwards, the microcontroller proceeds the associated control mechanism according to the third control signal CS3 with high voltage level. Furthermore, the microcontroller 140 may respectively the second control signal CS2 with low voltage level, a first switch signal SWS1 with high voltage level and the second switch SWS2 signal with low voltage level to a gate of the switch transistor M1, a control terminal of the first switch SW1 and a control terminal of the second switch SW2. Afterwards, switch SW1 and SW2 may respectively be switched-on and switched-off according to switch signal SWS1 and SWS2, so as to transmit the first reference voltage VREF1 served as the control voltage VC to the linear regulator 120. Meanwhile, the switch transistor M1 enters switched-off state according to the second control signal CS2 with high voltage level. Next, the linear regulator 120 outputs the output voltage VOUT according to the control voltage VC received. It is worth noticing that, in the non-discharge mode, the output voltage VOUT outputted from the linear regulator 120 make the DC-based uninterruptible power system 300 satisfy a condition, which is a subtraction result of the output voltage VOUT and the supply voltage VBUS is smaller than the conduction voltage VC. In other words, the output voltage VOUT is at least smaller than a sum of the supply voltage VBUS and the conduction voltage VD1 so as to cutoff the body diode D1. Therefore, in non-discharge mode, when the linear regulator 120 maintains the open-state, the output current IOUT does not flow to the output-side of the DC-based uninterruptible power system 300 via current path of the body diode D1, so that the embodiment not only effectively detects the supply voltage VBUS of the output-side of the power supply circuit, but also reduces energy loss in the non-discharge mode, and avoids reducing battery life due to frequently charge the battery unit 150 or energy-storing device of the DC-based uninterruptible power system 300.

Similarly, regarding discharge mode, when the voltage comparator 130 compares the supply voltage VBUS with the third reference voltage VREF3 at time t21 and accordingly detects that the DC power supply 10 interrupt electric power; which means when the supply voltage VBUS is smaller than the third reference voltage VREF3, the voltage comparator 130 transits the third reference voltage VREF3 with high voltage level to the third reference voltage VREF3 with low voltage level and transmits the third control signal CS3 to the microcontroller 140, wherein the voltage value of the third reference voltage VREF3 is smaller than the predetermined value of the supply voltage VBUS. Next, the microcontroller 140 may proceed associated control mechanism according to the third control signal with low voltage level. The microcontroller 140 outputs the second control signal CS2 with high voltage level to the gate of the switch transistor M1 and transits the first switch signal SWS1 with high voltage level to the first switch signal SWS1 with low voltage level, and simultaneously transits the second switch signal SWS2 with low voltage level to the second switch signal SWS2 with high voltage level, and that the microcontroller 140 may respectively the first switch signal SWS1 and the second switch signal SWS2 to the control terminal of the first switch SW1 and the second switch SW2. Afterwards, the switch SW1 and SW2 may respectively be switched-on and switched-off according to switch signal SWS1 and SWS2 so as to make the second reference voltage VREF2 be served as the control voltage VC, which is transmitted to the linear regulator 120. Meanwhile, the switch transistor enters switched-on state according to the second control signal CS2 with high voltage level. Next, the linear regulator 120 outputs the output voltage VOUT according to the control voltage VC received. It is worth noticing that, in the discharge mode, the output voltage VOUT outputted from the linear regulator 120 makes the DC-based uninterruptible power system satisfy a condition, which is the voltage value of the output voltage VOUT is substantially equal to predetermined voltage value of the supply voltage VBUS. In other words, the voltage value of the output voltage VOUT is at least larger than the supply voltage VBUS so that a drain-source voltage of the switch transistor M1 is larger than zero. In one embodiment, the predetermined voltage value of the supply voltage VBUS is 12 volts. Accordingly, in discharge mode, the linear regulator 120 may maintain open-state so as to provide larger current instantly, and the output current IOUT may flow to the output-side of the DC-based uninterruptible power system 300 via current path of the switch transistor M1, so as to provide the supply voltage VBUS to the load LD, i.e. the battery unit 150 provides electric energy to the load LD.

Accordingly, the voltage comparator 130 as the linear regulator 120 maintains open-state in the instant disclosure may quickly detect power supply situation of the output-side of power supply circuit, and make the DC-based uninterruptible power system 300 be capable of detecting power supply status of the output-side of the power supply circuit effectively in the discharge mode and the non-discharge mode, and reducing energy loss of the battery unit 150 in the non-discharge mode or other energy-storing device, so as to achieve effect of providing electric power normally.

[One Embodiment of the Abnormal Voltage Detection Method]

Figure 5:
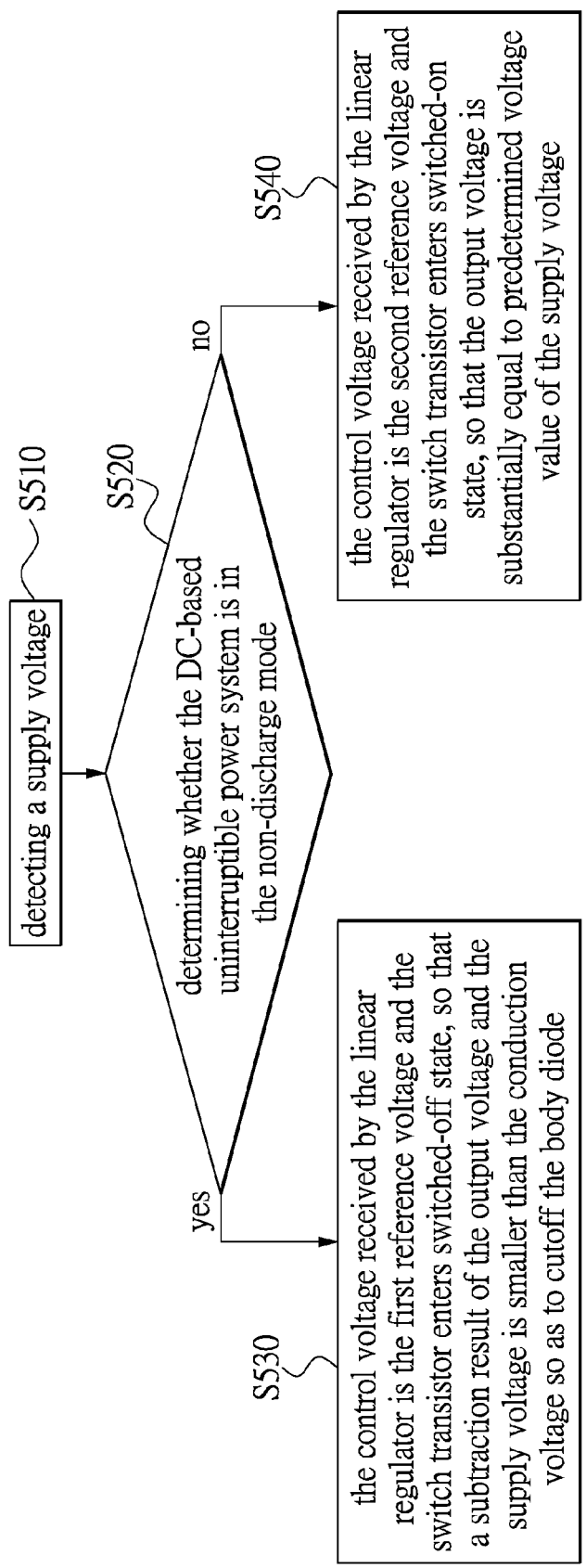
FIG. 5 shows a flow chart of an abnormal voltage detection method according to one embodiment of the instant disclosure.

Referring to FIG. 5, FIG. 5 shows a flow chart of an abnormal voltage detection method according to one embodiment of the instant disclosure. An explanatory sequence of steps in the present embodiment may be embodied with the DC-based uninterruptible power system 100 as shown in FIG. 1 or the DC-based uninterruptible power system 300 in FIG. 3, and thus please refer to FIGS. 1 and 3 for an easy understanding. The abnormal voltage detection method comprises steps as follows: detecting a supply voltage (step S510); determining whether the DC-based uninterruptible power system is in the non-discharge mode (step S520); if the DC-based uninterruptible power system is in the non-discharge mode, the control voltage received by the linear regulator is the first reference voltage and the switch transistor enters switched-off state, so that a subtraction result of the output voltage and the supply voltage is smaller than the conduction voltage so as to cutoff the body diode (step S530); and if the DC-based uninterruptible power system is in the discharge mode, the control voltage received by the linear regulator is the second reference voltage and the switch transistor enters switched-on state, so that the output voltage is substantially equal to predetermined voltage value of the supply voltage (step S540).

Relevant details of the steps of the abnormal voltage detection method regarding the DC-based uninterruptible power system are described in the embodiments of FIGS. 1-4, and thus it is not repeated thereto. It is clarified that, a sequence of steps in FIG. 5 is set for a need to instruct easily, and thus the sequence of the steps is not used as a condition in demonstrating the embodiments of the instant disclosure.

To sum up, the DC-based uninterruptible power system and method for detecting abnormal voltage provided by the instant disclosure, utilizes the voltage comparator to quickly detect electric power situation of the supply voltage of the output-side when the linear regulator opens, and reduces simultaneously energy loss of the battery unit or other energy-storing device in the non-discharge mode, so as to achieve the effect of providing electric power normally.

The descriptions illustrated supra set forth simply the preferred embodiments of the instant disclosure; however, the characteristics of the instant disclosure are by no means restricted thereto. All changes, alternations, or modifications conveniently considered by those skilled in the art are deemed to be encompassed within the scope of the instant disclosure delineated by the following claims.

What is claimed is:

1. A DC-based uninterruptible power system, electrically connected to a DC power supply, the dc-based uninterruptible power system outputting a DC voltage to be served as a supply voltage in a non-discharge mode and providing the DC voltage to a load, wherein when the DC power supply interrupts electric power, the DC-based uninterruptible power system enters a discharge mode, the DC-based uninterruptible power system comprising:

a multiplexer, electrically receiving a first control signal, a first reference voltage and a second reference voltage, and outputting a control voltage according to the first control signal, wherein the control voltage is either the first reference voltage or the second reference voltage;

a battery unit, electrically connected to the DC power supply via a charging circuit, the battery unit being used for outputting a discharge current in the discharge mode;

a linear regulator, electrically connected to the battery unit for receiving a battery voltage and electrically connected to the multiplexer for receiving the control voltage, and selectively outputting an output voltage in normal on-state with the discharge current from the battery unit to the load in the discharge mode according to the control voltage, wherein different voltage values of the control voltage are corresponding to different voltage values of the output voltage;

a switch transistor, having a gate, a drain, a source and a body diode, wherein the gate of the switch transistor electrically connected to the multiplexer so as to receive a second control signal and accordingly determining switched-on state or switched-off state, the drain of the switch transistor electrically connected to the linear regulator so as to receive the output voltage, the source of the switch transistor electrically connected to the load, and the body diode has a conduction voltage and when the DC-based uninterruptible power system is in non-discharge mode, the control voltage received by the linear regulator is the first reference voltage and the switch transistor enters switched-off state, so that a subtraction result of the output voltage and the supply voltage is smaller than the conduction voltage so as to cutoff the body diode;

a voltage comparator, electrically connected to source of the switch transistor so as to receive the supply voltage, for detecting a power supply status of the DC power supply and comparing the supply voltage and a third reference voltage transmitted from an outside source so as to output a third control signal accordingly; and a microcontroller, electrically connected between the voltage comparator and the multiplexer, for receiving the third control signal and transmitting the first control signal and the second control signal to the multiplexer and gate of the switch transistor correspondingly according to the third control signal, so as to instruct the multiplexer to choose either the first reference voltage or the second reference voltage and control switched-on state or switched-off state of the switch transistor.

2. The DC-based uninterruptible power system according to claim 1, wherein when the DC-based uninterruptible power system is in the discharge mode, the control voltage received by the linear regulator is the second reference voltage and the switch transistor enters switched-on state, so that the output voltage is equal to predetermined voltage value of the supply voltage, wherein the non-discharge mode is that the DC power supply provides electric power to the load, and the discharge mode is that the battery unit provides electric power to the load.

3. The DC-based uninterruptible power system according to claim 1, wherein when the voltage comparator determines that the DC power supply provides electric power normally, the voltage comparator transmits the third control signal to the microcontroller so that the microcontroller transmits the first control signal and the second control signal to the multiplexer and the switch transistor, and the multiplexer chooses the first reference voltage to be served as the control voltage according to the first control signal and transmits the control voltage to the linear regulator.

4. The DC-based uninterruptible power system according to claim 1, wherein when the voltage comparator determines that the DC power supply interrupts electric power, the voltage comparator transmits the third control signal to the microcontroller so that the microcontroller transmits the first control signal and the second control signal to the multiplexer and switch transistor respectively, and the multiplexer chooses the second reference voltage to be served as the control voltage and transmits the control voltage to the linear regulator.

5. The DC-based uninterruptible power system according to claim 1, wherein a positive terminal and a negative terminal of the voltage comparator respectively receives the supply voltage and the third reference voltage, wherein the third reference voltage is smaller than predetermined voltage value of the supply voltage.

6. The DC-based uninterruptible power system according to claim 1, the multiplexer comprising:

a first switch, one terminal of the first switch receiving the first reference voltage, another terminal of the first switch electrically connected to the linear regulator, and the first switch receiving a first switch signal and accordingly determining switched-on state or switched-off state; and a second switch, one terminal of the second switch receiving the second reference voltage, another terminal of the second switch electrically connected to the linear regulator, and the second switch receiving the second switch signal and accordingly determining switched-on state or switched-off state, wherein the first switch signal and the second switch signal are the first control signal.

7. A abnormal voltage detection method, used for a DC-based uninterruptible power system, the DC-based uninterruptible power system electrically connected to the DC power supply, the dc-based uninterruptible power system outputting a DC voltage to be served as a supply voltage in a non-discharge mode and providing the DC voltage to a load, wherein when the DC power supply interrupts electric power, the DC-based uninterruptible power system enters a discharge mode, the DC-based uninterruptible power system comprising:

a multiplexer, a battery unit, a linear regulator, a switch transistor, a voltage comparator and a microcontroller;

the multiplexer electrically receiving a first control signal, a first reference voltage and a second reference voltage and outputting a control voltage according to the first control signal, wherein the control voltage is either the first reference voltage or the second reference voltage;

the battery unit electrically connected to the DC power supply via a charging circuit, the battery unit being used for outputting a discharge current in the discharge mode;

the linear regulator electrically connected to the battery unit for receiving a battery voltage and electrically connected to the multiplexer for receiving the control voltage, and selectively outputting an output voltage in normal on-state with the discharge current from the battery unit to the load in the discharge mode according to the control voltage, wherein different voltage values of the control voltage are corresponding to different voltage values of the output voltage;

the switch transistor having a gate, a drain, a source and a body diode, wherein the gate of the switch transistor electrically connected to the multiplexer so as to receive a second control signal and accordingly determining switched-on state or switched-off state, the drain of the switch transistor electrically connected to the linear regulator so as to receive the output voltage, the source of the switch transistor electrically connected to the load, and the body diode has a conduction voltage;

the voltage comparator electrically connected to source of the switch transistor so as to receive the supply voltage for detecting a power supply status of the DC power supply and comparing the supply voltage and a third reference voltage transmitted from an outside source so as to output a third control signal accordingly;

the microcontroller electrically connected between the voltage comparator and the multiplexer for receiving the third control signal and transmitting the first control signal and the second control signal to the multiplexer and gate of the switch transistor correspondingly according to the third control signal, so as to instruct the multiplexer to choose either the first reference voltage or the second reference voltage and control switched-on state or switched-off state of the switch transistor;

the abnormal voltage detection method comprising:

determining whether the DC-based uninterruptible power system is in the non-discharge mode; and whether the DC-based uninterruptible power system is in the non-discharge mode, the control voltage received by the linear regulator is the first reference voltage and the switch transistor enters switched-off state, so that a subtraction result of the output voltage and the supply voltage is smaller than the conduction voltage so as to cutoff the body diode; wherein when the voltage comparator determines that the DC power supply provides electric power normally, the voltage comparator transmits the third control signal to the microcontroller so that the microcontroller transmits the first control signal and the second control signal to the multiplexer and the switch transistor, and the multiplexer chooses the first reference voltage to be served as the control voltage according to the first control signal and transmits the control voltage to the linear regulator; wherein when the voltage comparator determines that the DC power supply interrupts electric power, the voltage comparator transmits the third control signal to the microcontroller so that the microcontroller transmits the first control signal and the second control signal to the multiplexer and switch transistor respectively, and the multiplexer chooses the second reference voltage to be served as the control voltage and transmits the control voltage to the linear regulator.

8. The abnormal voltage detection method according to claim 7, wherein when the DC-based uninterruptible power system is in the discharge mode, the control voltage received by the linear regulator is the second reference voltage and the switch transistor enters switched-on state, so that the output voltage is equal to predetermined voltage value of the supply voltage, wherein the non-discharge mode is that the DC power supply provides electric power to the load, and the discharge mode is that the battery unit provides electric power to the load.

* * * * *